(12) United States Patent
Asada et al.

(10) Patent No.: US 10,665,470 B2
(45) Date of Patent: May 26, 2020

(54) ETCHING METHOD AND ETCHING APPARATUS

(71) Applicant: TOKYO ELECTRON LIMITED, Tokyo (JP)

(72) Inventors: Yasuo Asada, Nirasaki (JP); Takehiko Orii, Nirasaki (JP); Shinji Irie, Nirasaki (JP); Nobuhiro Takahashi, Nirasaki (JP); Ayano Hagiwara, Nirasaki (JP); Tatsuya Yamaguchi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/232,532

(22) Filed: Dec. 26, 2018

(65) Prior Publication Data

US 2019/0198349 A1    Jun. 27, 2019

(30) Foreign Application Priority Data

Dec. 27, 2017  (JP) .................................. 2017-251800
Nov. 1, 2018   (JP) .................................. 2018-206819

(51) Int. Cl.
*H01L 21/321*    (2006.01)
*H01L 21/3213*   (2006.01)
*H01L 21/67*     (2006.01)
*H01L 29/66*     (2006.01)
*H01L 21/02*     (2006.01)
*H01L 21/3105*   (2006.01)
*H01L 21/768*    (2006.01)
*H01L 21/687*    (2006.01)

(52) U.S. Cl.
CPC .. *H01L 21/32135* (2013.01); *H01L 21/02118* (2013.01); *H01L 21/31058* (2013.01); *H01L 21/32139* (2013.01); *H01L 21/67017* (2013.01); *H01L 21/6719* (2013.01); *H01L 21/67069* (2013.01); *H01L 21/67103* (2013.01); *H01L 21/67173* (2013.01); *H01L 21/68742* (2013.01); *H01L 21/768* (2013.01); *H01L 29/66545* (2013.01); *H01L 21/0228* (2013.01); *H01L 21/02271* (2013.01)

(58) Field of Classification Search
CPC ................................................. H01L 21/32135
USPC .......................................................... 438/695
See application file for complete search history.

(56) References Cited

FOREIGN PATENT DOCUMENTS

| JP | 2000353305 A | 12/2000 |
|---|---|---|
| JP | 4940722 B2 | 3/2012 |
| JP | 2016-63141 A | 4/2016 |
| KR | 1020150032160 A | 3/2015 |

*Primary Examiner* — Roberts P Culbert
(74) *Attorney, Agent, or Firm* — Nath, Goldberg & Meyer; Jerald L. Meyer

(57) ABSTRACT

There is provided an etching method which includes: forming a blocking film configured to prevent an etching gas for etching a silicon-containing film from passing through each pore of a porous film and prevent the etching gas from being supplied to a film not to be etched, by supplying at least one film-forming gas to a substrate in which the silicon-containing film, the porous film, and the film not to be etched are sequentially formed adjacent to each other in a lateral direction; and etching the silicon-containing film by supplying the etching gas.

8 Claims, 15 Drawing Sheets

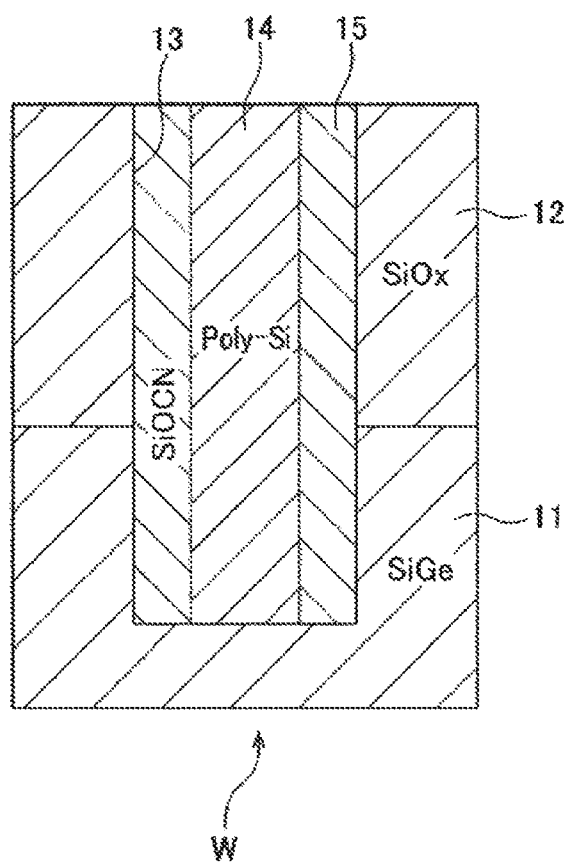

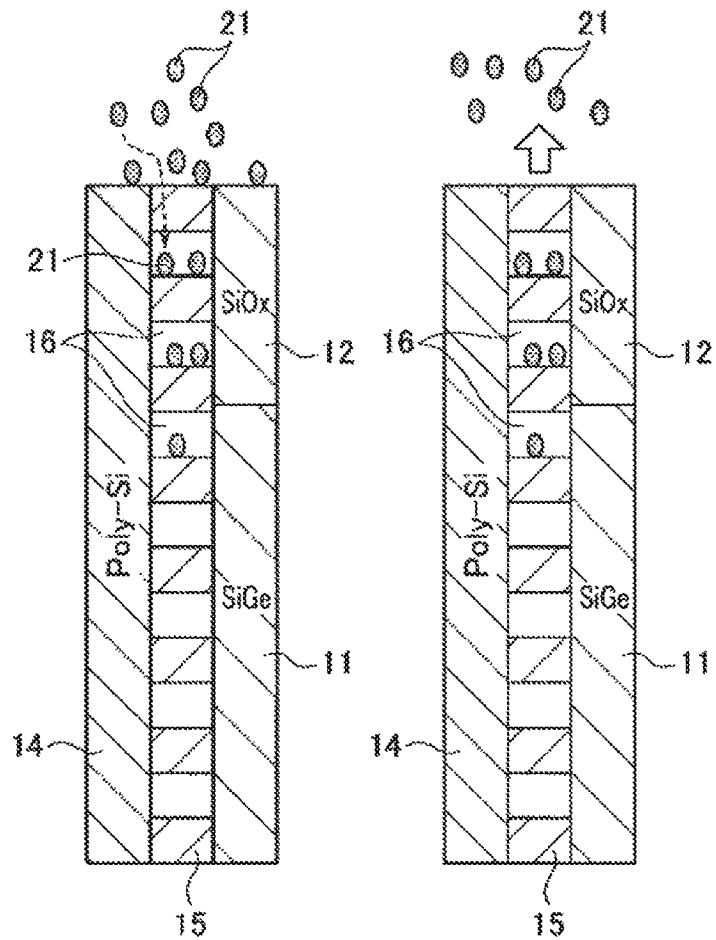

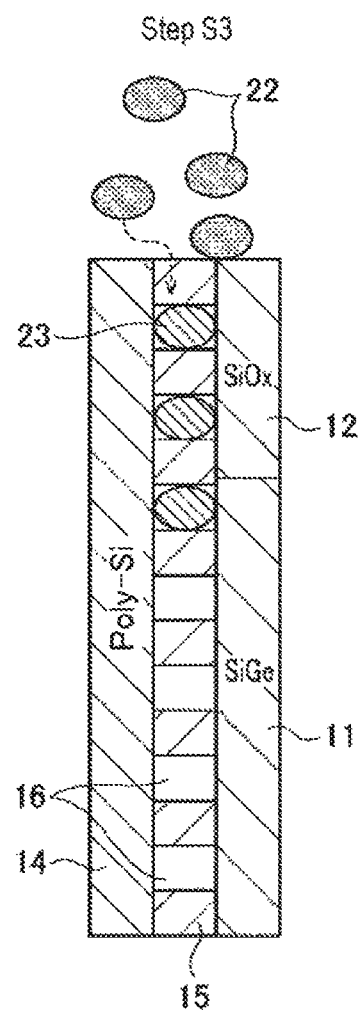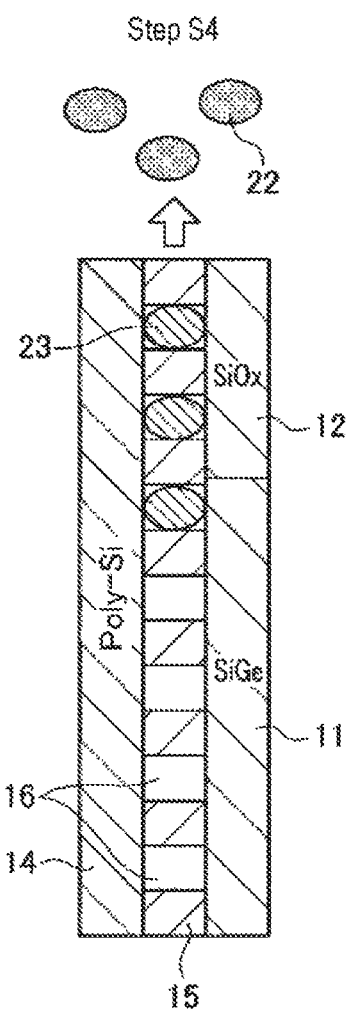

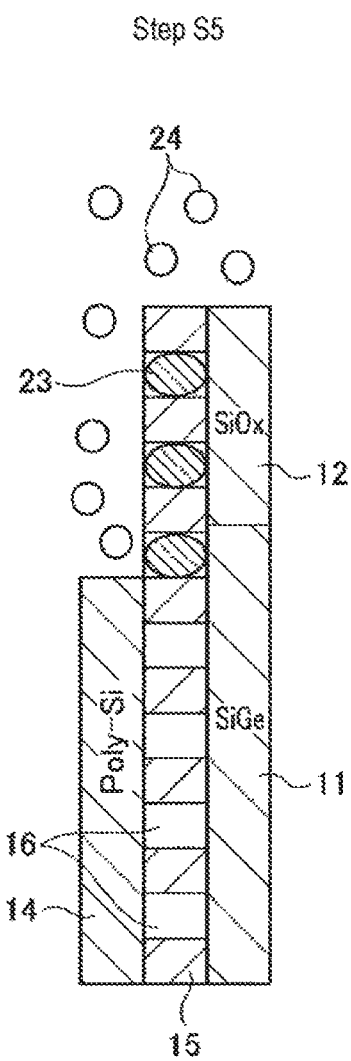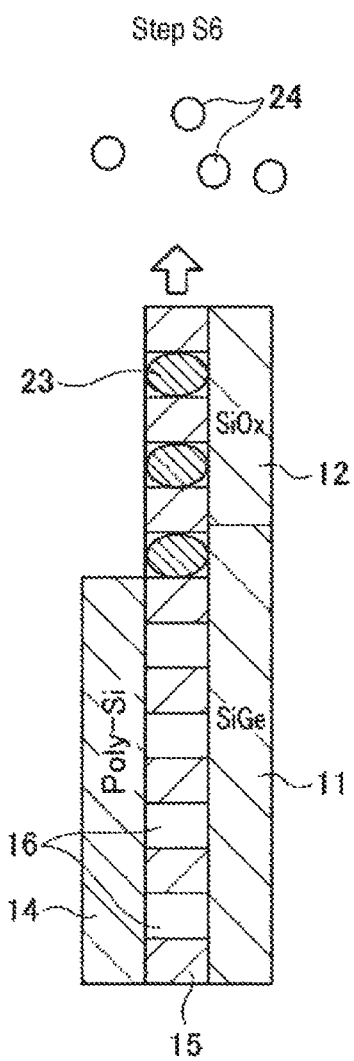

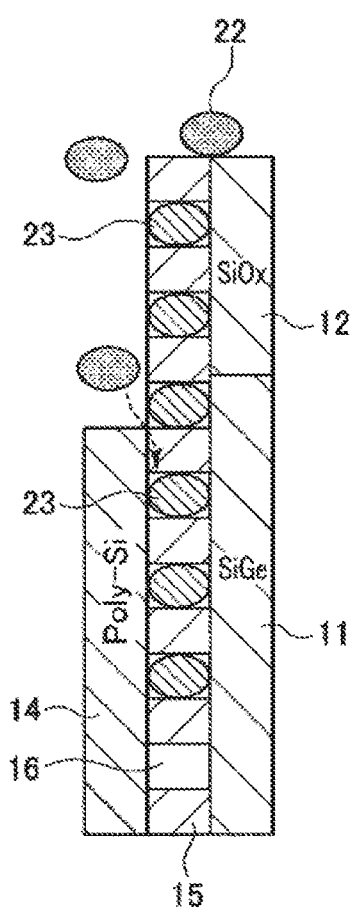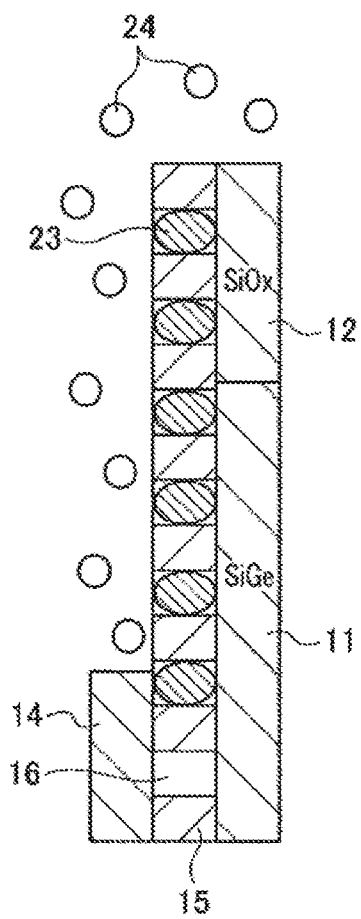

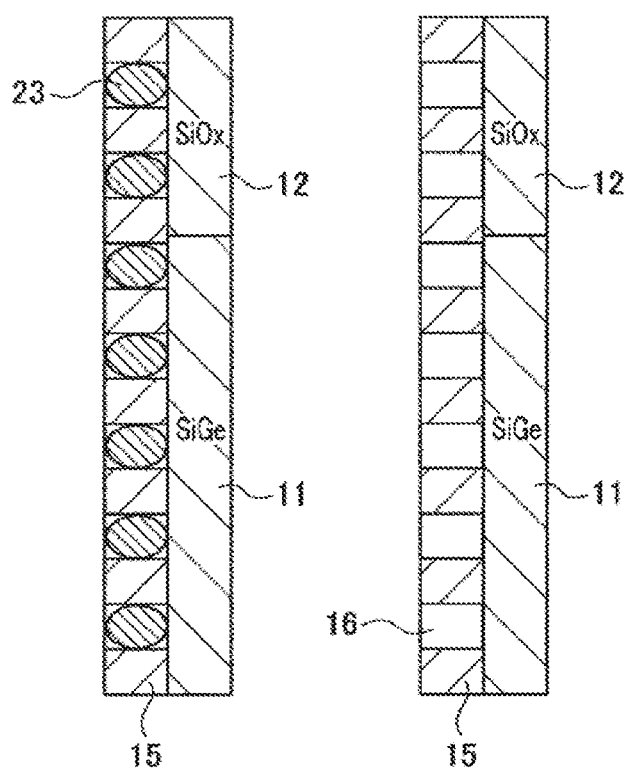

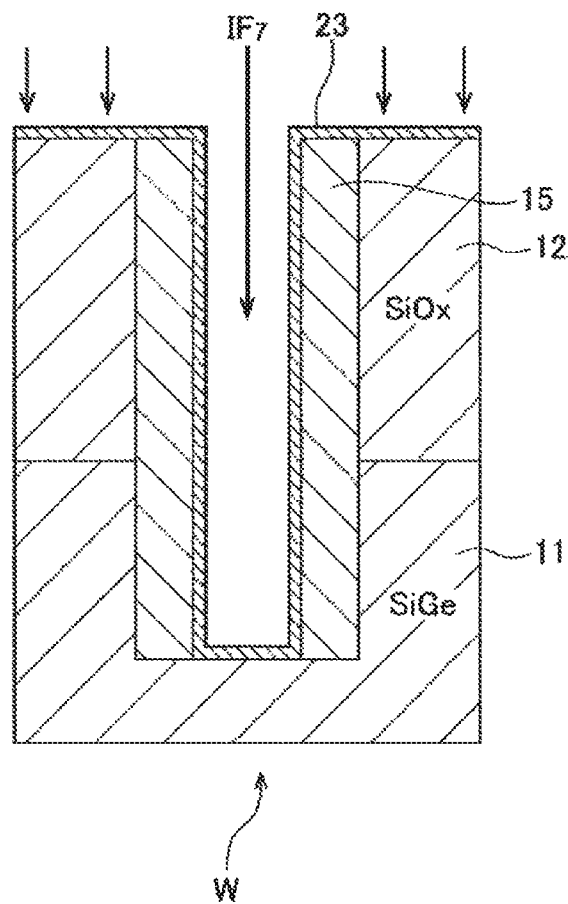

ETCHING METHOD AND ETCHING APPARATUS

CROSS-REFERENCE TO RELATED APPLICATIONS

This application is based upon and claims the benefit of priority from Japanese Patent Application Nos. 2017-251800 and 2018-206819, filed on Dec. 27, 2017 and Nov. 1, 2018, respectively, the entire contents of which are incorporated herein by reference.

TECHNICAL FIELD

The present disclosure relates to a technique for etching a silicon-containing film formed adjacent to a porous film in a substrate.

BACKGROUND

An interlayer insulating film in which wiring constituting a semiconductor device is embedded is often formed of a low dielectric constant film called a "low-k film". The low-k film is constituted by, for example, a porous film. Etching is sometimes performed with respect to a semiconductor wafer (hereinafter, referred to as a "wafer") in which such a porous film is formed in a process of manufacturing the semiconductor device.

For example, there is known a technique for etching a wafer having an interlayer insulating film as a low-k film formed therein to form a recess for embedding wiring. A film is formed in the recess in order to prevent the recess from being exposed to the air until the wiring is embedded in the recess by supplying the film-forming gases. In addition, there is known a technique for etching an organic film embedded in a recess formed in a low-dielectric constant film as a porous film, using plasma of a process gas containing a predetermined amount of carbon dioxide.

In manufacturing a semiconductor device, a process of removing a polysilicon film from a wafer on which the polysilicon film, a SiOCN film as a porous film, and a stacked body of an upper-lying silicon oxide film and an underlying SiGe (silicon germanium) film are formed adjacent to each other in this order in the lateral direction, is sometimes performed. If the removal of the polysilicon film is performed by dry etching, an etching gas may pass through the SiOCN film to thus reach the SiGe film during the etching of the polysilicon film. More specifically, since the SiOCN film is a porous film, the etching gas passes through pores of the porous film from the side of the SiOCN film and reaches the sidewall of the SiGe film. Although the SiGe film is not a target to be removed by etching, the sidewall thereof may be etched by the etching gas thus supplied.

Therefore, for example, a process of removing an upper portion of the polysilicon film by plasma-based anisotropic etching, followed by removing a lower portion of the polysilicon film by wet etching, is performed in some cases. Since the permeability of an etchant used for the wet etching with respect to the SiOCN film is lower than that of the etching gas, etching of the SiGe film is suppressed. However, the multiple operations described above require a lot of labor, and it is impossible to perform the process using wet etching due to the miniaturization of a device. In addition, the thickness of the sidewall of the SiOCN film tends to be reduced. Thus, in the case where the thickness of the sidewall of the SiOCN film is further reduced in the future, the permeability of the etchant with respect to the SiOCN film may be increased, so that the SiGe film may be etched

SUMMARY

Some embodiments of the present disclosure provide a technique for preventing a film not to be etched from being etched in a process of removing a silicon-containing film (including a case of silicon alone) by supplying an etching gas to a substrate on which the silicon-containing film, a porous film, and a film not to be etched are formed adjacent to each other in this order in the lateral direction.

According to one embodiment of the present disclosure, there is provided an etching method which includes: forming a blocking film configured to prevent an etching gas for etching a silicon-containing film from passing through each pore of a porous film and prevent the etching gas from being supplied to a film not to be etched, by supplying at least one film-forming gas to a substrate in which the silicon-containing film, the porous film, and the film not to be etched are sequentially formed adjacent to each other; and etching the silicon-containing film by supplying the etching gas.

According to another embodiment of the present disclosure, there is provided an etching apparatus which includes: a processing container; a mounting part provided inside the processing container and configured to mount a substrate on the mounting part, the substrate including a silicon-containing film, a porous film, and a film not to be etched which are sequentially formed adjacent to each other; a film-forming gas supply part configured to supply a film-forming gas into the processing container so as to form a blocking film configured to prevent an etching gas for etching the silicon-containing film from passing through each pore of the porous film and prevent the etching gas from being supplied to the film not to be etched; and an etching gas supply part configured to supply the etching gas into the processing container.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 1 is a longitudinal sectional view of a surface of a wafer on which etching according to the present disclosure is performed.

FIGS. 2A to 2D are process diagrams for explaining an etching process according to the present disclosure.

FIGS. 3A and 3B are process diagrams for explaining the etching process according to the present disclosure.

FIGS. 4A to 4D are process diagrams for explaining the etching process according to the present disclosure.

FIG. 15 is a longitudinal sectional view of a wafer in an evaluation test.

DETAILED DESCRIPTION

Figure 5:
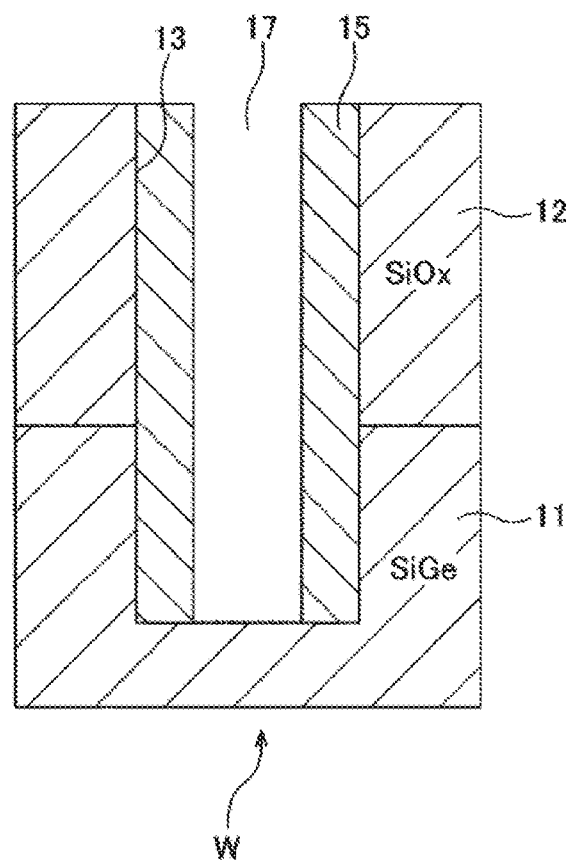
FIG. 5 is a longitudinal sectional view of the surface of the wafer which has been subjected to the etching process.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

FIG. 1 is a longitudinal sectional view of a surface of a wafer W to which a process according to an embodiment of the present disclosure is performed. In FIG. 1, reference numeral 11 denotes an SiGe film. A silicon oxide (SiOx) film 12 is stacked on the SiGe film 11. A stacked body of the silicon oxide film 12 and the SiGe film 11 includes a recess 13 formed therein. A polysilicon film 14 is embedded in the recess 13. In addition, a SiOCN film 15, namely a film including silicon, oxygen, nitrogen and carbon, is formed between a sidewall of the polysilicon film 14 and a sidewall of the recess 13 so as to surround the side of the polysilicon film 14 and so as to come into contact with the sidewall of the polysilicon film 14 and the sidewall of the recess 13. Therefore, the polysilicon film 14, the SiOCN film 15, and the SiGe film 11 are formed adjacent to each other in this order when view in a lateral direction. The SiOCN film 15 is an interlayer insulating film, and is a porous film.

The outline of processes according to an embodiment of the present disclosure will be described. A process of supplying a film-forming gas for forming a polyurea film, which is a polymer (polyurea) having a urea bond, in pores of the SiOCN film 15 and a process of supplying an etching gas for etching the polysilicon film 14, which is a film to be etched, are alternately repeated. That is to say, the polysilicon film 14 is etched at intervals, the polyurea film is formed to be embedded in the pores between two consecutive etching processes. Thus, the etching gas is prevented from passing through the SiOCN film 15 from the side thereof and from etching the sidewall of the SiGe film 11, which is a film not to be etched.

The silicon oxide film 12 serves as an etching mask film when etching the polysilicon film 14. In addition, for example, an $IF_7$ (iodine heptafluoride) gas has a low etching selectivity to the silicon oxide film 12 and the polyurea film, and a high etching selectivity to the polysilicon film 14. Thus, the $IF_7$ gas is used as the etching gas. Further, the $IF_7$ gas has a relatively large molecular weight. Thus, it is considered that the $IF_7$ gas hardly passes through the pores of the SiOCN film 15. There is an expectation that the supply of the $IF_7$ gas to the SiGe film 11 is suppressed in a more reliable manner.

In the present embodiment, a first film-forming gas containing an amine as a monomer and a second film-forming gas containing an isocyanate as a monomer are supplied to the wafer W to cause a polymerization reaction, thereby forming the polyurea film. For example, 1, 3-bis (aminomethyl) cyclohexane (H6XDA) may be used as the amine, and 1, 3-bis (isocyanatomethyl) cyclohexane (H6XDI) may be used as the isocyanate, respectively. Alternatively, hexylamine may be used as the amine, and tert-butylisocyanic acid may be used as the isocyanate. In addition, the amine and the isocyanate which are capable of forming the polyurea film are not limited to the above examples, and specific examples thereof will be given later.

Next, a process performed on the wafer W will be described with reference to FIGS. 2A to 4D. FIGS. 2A to 4D are schematic diagrams showing states in which the surface portion of the wafer W described in FIG. 1 is changed with the process. In the figures, pores formed in the SiOCN film 15 are indicated by reference numeral 16, the first film-forming gas as an amine is indicated by reference numeral 21, the second film-forming gas as an isocyanate is indicated by reference numeral 22, the polyurea film is indicated by reference numeral 23, and the etching gas as $IF_7$ is indicated by reference numeral 24. In addition, processes shown in FIGS. 2A to 4D are performed in the state in which the wafer W is loaded into a processing container and the interior of the processing container is exhausted to become a vacuum atmosphere of a predetermined pressure.

First, the first film-forming gas 21 is supplied into the processing container (Step S1 in FIG. 2A). The first film-forming gas 21 flows into the pores 16 in an upper portion of the SiOCN film 15 and is adsorbed onto respective walls of the pores 16. Subsequently, the supply of the first film-forming gas 21 into the processing container is stopped. The interior of the processing container is exhausted and a purge gas such as an $N_2$ (nitrogen) gas is supplied into the processing container (Step S2 in FIG. 2B). The first film-forming gas 21 that has not flowed into the pores 16 is removed with an air flow of the purge gas which is being exhausted.

Subsequently, the second film-forming gas 22 is supplied into the processing container (Step S3 in FIG. 2C). The second film-forming gas 22 flows into the pores 16 in the upper portion of the SiOCN film 15 so that the second film-forming gas 22 reacts with the first film-forming gas 21 adsorbed onto the pores 16. Thus, the polyurea film 23, which is a film for preventing passage of the etching gas, is formed, and the pores 16 are clogged. Thereafter, the supply of the second film-forming gas 22 into the processing container is stopped. The exhaust of the interior of the processing container and the supply of the purge gas into the processing container are performed (Step S4 in FIG. 2D). Thus, the second film-forming gas 22 that has not flowed into the pores 16 is removed with an air flow of the purge gas which is being exhausted.

Subsequently, the etching gas 24 is supplied into the processing container (Step S5 in FIG. 3A) to etch the polysilicon film 14. Thus, the sidewall of the upper portion of the SiOCN film 15 is exposed. At this time, the polyurea film 23 embedded in the pores 16 of the upper portion of the SiOCN film 15 is hardly etched by the etching gas 24. Therefore, the etching gas 24 is prevented from passing through the pores 16, which makes it possible to prevent the etching gas 24 from passing through the SiOCN film 15 from the side thereof and to prevent the sidewall of the SiGe film 11 from being etched. Thereafter, the supply of the etching gas 24 into the processing container is stopped. The interior of the processing container is exhausted and the purge gas is supplied into the processing container (Step S6 in FIG. 3B). Thus, the etching gas 24 remaining in the processing container is removed with an air flow of the purge gas which is being exhausted.

Subsequently, the first film-forming gas 21 is supplied into the processing container. That is to say, Step S1 is performed again. Since the polysilicon film 14 is etched and the sidewall of the upper portion of the SiOCN film 15 is exposed in Step S5, the first film-forming gas 21 supplied in a second round of Step S1 is supplied to the pores 16 of a lower portion of the SiOCN film 15, which are positioned below the pores 16 into which the first film-forming gas 21 supplied in the first round of Step S1 has been flown. Thus, the first film-forming gas 21 is adsorbed onto the walls of the lower pores 16.

Subsequently, the exhaust of the interior of the processing container and the supply of the purge gas into the processing container in Step S2 are performed again. Thereafter, the supply of the second film-forming gas 22 into the processing container in Step S3 is performed again. Like the first film-forming gas 21 supplied into the processing container in the second round of Step S1, the second film-forming gas 22 is also supplied to the pores 16 of a lower portion of the SiOCN film 15, which are positioned below the pores 16 into which the second film-forming gas 22 supplied in the first round of Step S3 has been flown. The second film-forming gas 22 reacts with the first film-forming gas 21 which has been adsorbed onto the lower pores 16, thereby forming lower polyurea films 23. Therefore, in the second round of Step S3, a region where the polyurea films 23 are formed is extended downward in the SiOCN film 15 (FIG. 4A).

Subsequently, the exhaust of the interior of the processing container and the supply of the purge gas into the processing container in Step S4 are performed again. Thereafter, the supply of the etching gas 24 in Step S5 is performed so that the polysilicon film 14 is further etched downward and the exposed area of the sidewall of the SiOCN film 15 is extended downward. As described above, in the second round of Step S3, since the region where the polyurea films 23 are formed is extended downward in the SiOCN film 15, the pores 16 in the vicinity of the sidewall of the SiOCN film 15, which are newly exposed by the etching of the polysilicon film 14, are embedded with the respective polyurea films 23. Therefore, even in a second round of Step S5, it is possible to prevent the etching gas from passing through the pores 16 of the SiOCN film 15 and to prevent the sidewall of the SiGe film 11 from being etched (FIG. 4B). After the etching, the exhaust of the interior of the processing container and the supply of the purge gas into the processing container are performed again in Step S6.

A sequence of Steps S1 to S6 performed in this order is assumed to be a cycle. For example, even after the second round of Step S6, the cycle is repeated so that the polyurea films 23 are continuously formed in the lower portion of the SiOCN film 15. As a result, the polysilicon film 14 is etched downward while the sidewall of the SiGe film 11 is prevented from being etched. Subsequently, for example, when the polysilicon film 14 is completely etched and when a predetermined number of cycles is carried out (FIG. 4C), the wafer W is heated to, for example, 100 degrees C. or more, specifically 300 degrees C. or more. Thus, the polyurea films 23 embedded in the respective pores 16 are vaporized or depolymerized so that they are removed from the wafer W (FIG. 4D). Etching residue adhering to the surface of the wafer W is also vaporized and removed together with the polyurea films 23 by the heating (Step S7). FIG. 5 shows a state in which the polyurea films 23 have been removed by the etching of the polysilicon film 14 as described above. For example, in a subsequent process, a gate of a semiconductor device is formed in a recess 17 formed by removing the polysilicon film 14.

According to the process of the embodiment of the present disclosure, the polysilicon film 14 can be etched by the etching gas while suppressing the SiGe film from being etched by the etching gas. In addition, in the process of the embodiment of the present disclosure, compared with the case where the wet etching-based process is performed after the plasma process as described in the Background section of the present disclosure, it is not necessary to switch an atmosphere around the wafer W from a vacuum atmosphere in which the plasma process is performed to an atmospheric environment in which the wet etching is performed. Therefore, the process of the embodiment of the present disclosure has an advantage that a period of time and effort required for the process can be reduced. In addition, according to the process of the present embodiment, there is no need to use plasma. Thus, the respective films on the surface of the wafer W are not damaged by the plasma, which makes it possible to improve the reliability of a semiconductor device formed on the wafer W. Further, the present disclosure encompasses a case where etching is performed using plasma.

In some embodiments, an exhaust amount of the processing container in Steps S1 to S6 may be constant. Further, the exhaust amounts in Steps S2, S4, and S6 for removing unnecessary gases from the interior of the processing container may be greater than those in Steps S1, S3, and S5 in order to remove the gases in a more reliable manner. Alternatively, unnecessary gases may be removed by only the exhaust without supplying the purge gas in Steps S2, S4, and S6. In addition, as described above, the etching selectivity of the $IF_7$ gas as an etching gas with respect to the polyurea film 23 is relatively low. Thus, if the polyurea film 23 is formed on the surface of the polysilicon film 14, the polysilicon film 14 is hardly etched. However, the redundant first film-forming gas 21 and the redundant second film-forming gas 22 are removed in Steps S2 and S4 as described above. That is to say, by performing Steps S2 and S4, it is possible to etch the polysilicon film 14 in a more reliable manner.

A silicon-containing film other than the polysilicon film 14 may be a film to be etched. Such a silicon-containing film contains silicon as a main component. More specifically, the silicon-containing film includes, for example, an amorphous silicon film, a single-crystal silicon film, an SiGe film or the like. Any gas may be used as the etching gas as long as it can etch the silicon-containing film. More specifically, in addition to the $IF_7$ gas, examples of the etching gas may include a gas containing fluorine, such as a fluorine ($F_2$) gas, a $ClF_3$ (chlorine trifluoride) gas, an $IF_5$ (iodine pentafluoride) gas, a $BrF_3$ (bromine trifluoride) gas, or the like.

Although the film not to be etched is the SiGe film 11 in the above embodiment, it may be, for example, a Si film. Alternatively, the film not to be etched may be a film other than the silicon-containing film such as the Si film or the SiGe film 11. In addition, the mask film formed on the SiGe film 11 is not limited to the silicon oxide film 12 as long as it can prevent the SiGe film 11 from being etched from above during the etching. Furthermore, the porous film is not limited to the SiOCN film 15. For example, a porous film such as a SiCO film, a SiCOH film or the like may be formed instead of the SiOCN film 15.

Figure 6:
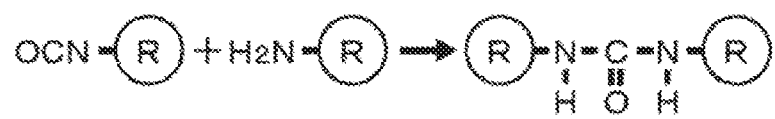
FIG. 6 is an explanatory view showing a reaction in which a polymer having a urea bond is produced by film-forming gases.

In addition, the film-forming gases for forming the polyurea film 23 are not limited to the above example. For example, 1, 12-diaminododecane (DAD) may be used as the amine, and 4, 4'-diphenylmethane diisocyanate (MDI) may be used as the isocyanate. DAD may be used as the amine, and H6XDI may be used as the isocyanate. Alternatively, hexamethylenediamine may be used as the amine, and H6XDI may be used as the isocyanate. As the amine, for example, 1, 6-diaminohexane, cyclohexylamine, hexylamine, butylamine, and tert-butylamine may be used in addition to the respective compounds described above. As the isocyanate, for example, 1,6-diisocyanic acid hexane, cyclohexylisocyanic acid, hexylisocyanic acid, butylisocyanic acid, and tert-butylisocyanic acid may be used in addition to the respective compounds described above. In other words, one selected from the amine compounds mentioned above and one selected from the isocyanate compounds mentioned above may be used for the formation of the polyurea films 23. Variations of the reaction between the isocyanate and the amine will be additionally described. In this reaction, as shown in FIG. 6, a monofunctional molecule may be used as a raw material monomer constituting the film-forming gas. In addition, a gas generated by heating the polyurea for depolymerization and vaporization may be supplied to the wafer W as a film-forming gas. The gas is cooled down and adsorbed onto the surface of the wafer W to cause a polymerization reaction, so that the poly urea film may be formed again. Therefore, the film-forming gases are not limited to two types of gases such as the first film-forming gas and the second film-forming gas supplied to the wafer W.

Although the series of Steps S1 to S6 has been described to be repeated three times or more in the example of the processes described with reference to FIGS. 2A to 4D, the series of Steps S1 to S6 may be repeated only twice. In addition, although the wafer W has been described to be heated in Step S7 such that the polyurea films 23 are removed from the SiOCN film 15, the polyurea films 23 may remain in the respective pores 16 of the SiOCN film 15 as long as there is no practical problem with the dielectric constant of the SiOCN film 15 even if the polyurea films 23 remain in the respective pores 16. Therefore, the present disclosure encompasses a case where the polyurea films 23 are not removed in Step S7.

Subsequently, a substrate processing apparatus 3 for executing the series of processes described in FIGS. 2A to 4D will be described with reference to a plan view of FIG. 7. The substrate processing apparatus 3 includes a loading/unloading part 31 for loading/unloading the wafer W, two load lock chambers 41 provided adjacent to the loading/unloading part 31, two heat treatment modules 40 provided adjacent to the two load lock chambers 41, respectively, and two etching modules 5 provided adjacent to the two heat treatment modules 40, respectively.

The loading/unloading part 31 includes a normal-atmosphere transfer chamber 33 kept in a normal atmosphere and provided with a first substrate transfer mechanism 32 therein, and a carrier mounting table 35 provided at the side of the normal-atmosphere transfer chamber 33. Carriers 34 each configured to receive the wafers W are mounted on the carrier mounting table 35. Reference numeral 36 in FIG. 7 denotes an orienter chamber provided adjacent to the normal-atmosphere transfer chamber 33. The orienter chamber is provided to optically calculate an eccentric amount of the wafer W, which is generated by rotating the wafer W, and to align the wafer W with respect to the first substrate transfer mechanism 32. The first substrate transfer mechanism 32 transfers the wafer W between the carrier 34 mounted on the carrier mounting table 35, the orienter chamber 36, and the load lock chambers 41.

A second substrate transfer mechanism 42 having, for example, an articulated arm structure, is provided inside each of the load lock chambers 41. The second substrate transfer mechanism 42 transfers the wafer W between the load lock chamber 41, the heat treatment module 40, and the etching module 5. The interior of a processing container constituting the heat treatment module 40 and the interior of a processing container constituting the etching module 5 are kept in a vacuum atmosphere. The internal atmosphere of each of the load lock chambers 41 is switched to the normal atmosphere or the vacuum atmosphere in order to deliver the wafer W between the processing container kept in the vacuum atmosphere and the normal-atmosphere transfer chamber 33 kept in the normal atmosphere.

Figure 7:
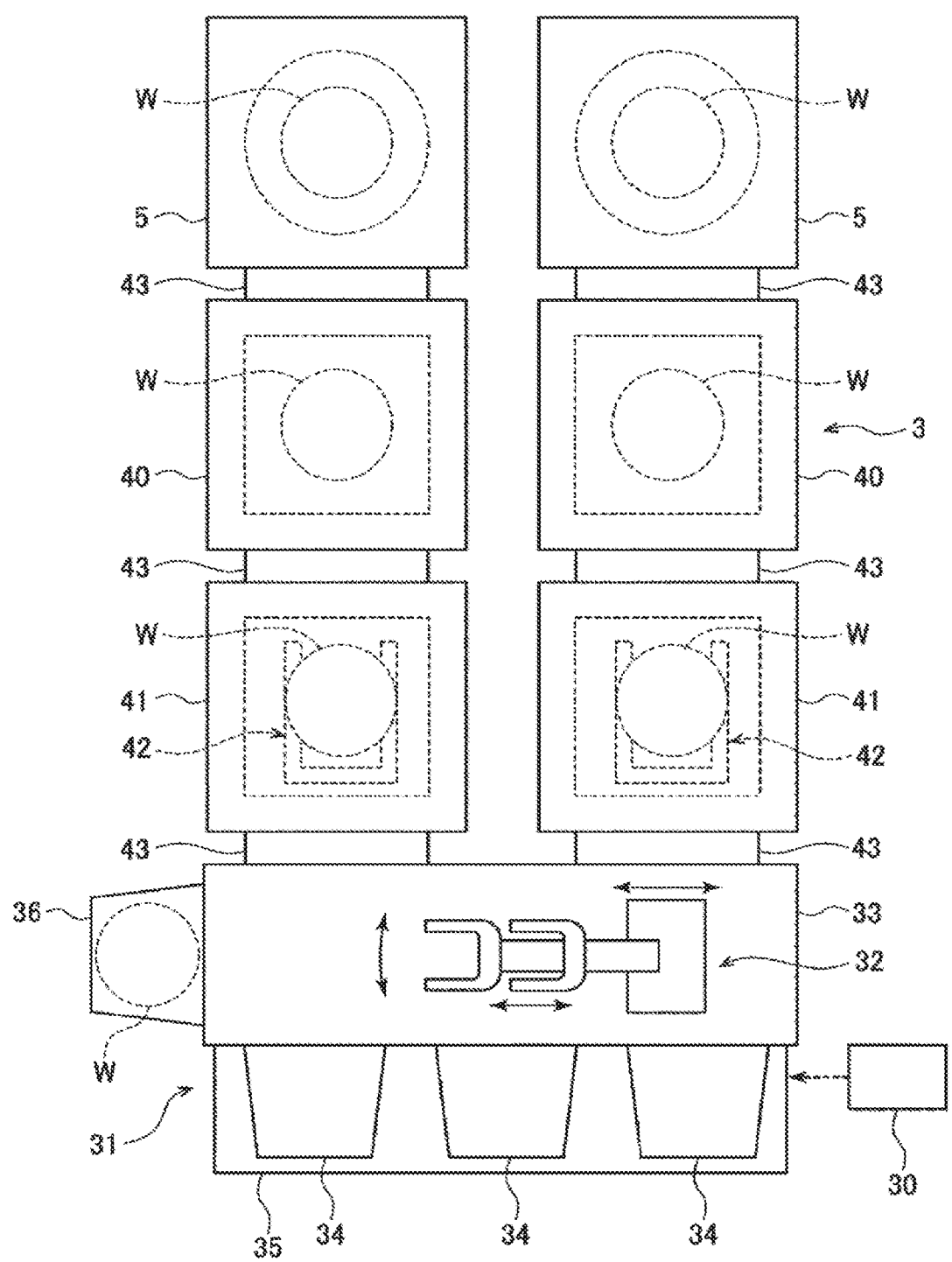
FIG. 7 is a plan view of a substrate processing apparatus for performing etching.

In FIG. 7, reference numeral 43 denotes an openable/closable gate valve. The gate valves 43 are provided between the normal-atmosphere transfer chamber 33 and the load lock chambers 41, between the load lock chambers 41 and the heat treatment modules 40, and between the heat treatment modules 40 and the etching modules 5, respectively. The heat treatment module 40 includes the aforementioned processing container, an exhaust mechanism for exhausting the interior of the processing container to become a vacuum atmosphere, and a mounting table provided inside the processing container and configured to heat the wafer W mounted thereon. The heat treatment module 40 is configured to execute Step S7 described above.

Figure 8:
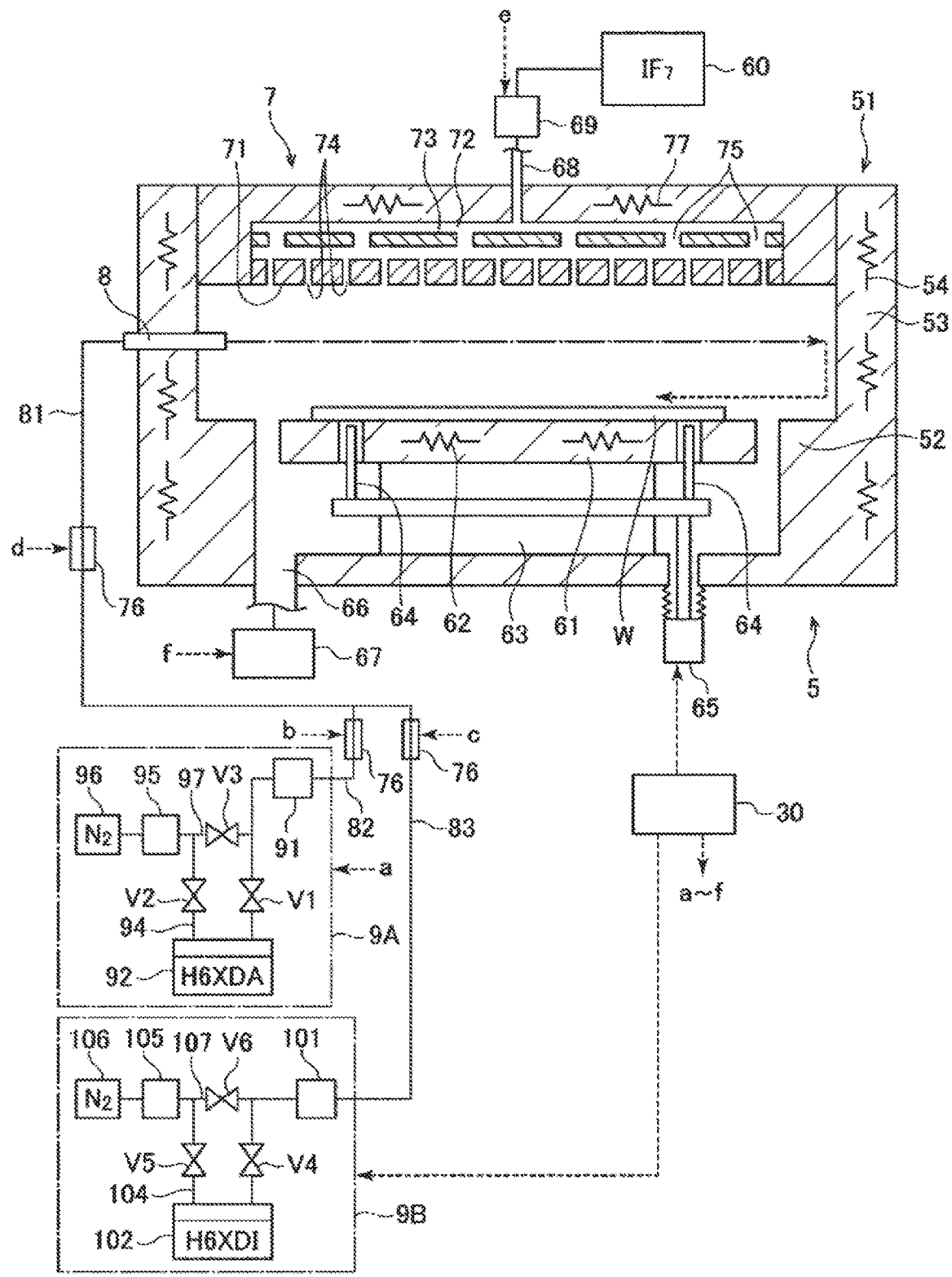
FIG. 8 is a longitudinal sectional view of an etching module provided in the substrate processing apparatus.

Next, the etching module 5 will be described with reference to a longitudinal sectional view of FIG. 8 and a transverse plan view of FIG. 9. The etching module 5 includes, for example, a circular processing container 51 in which the processes of Steps S1 to S6 are performed with respect to the wafer W. That is to say, etching and film formation are performed in the single processing container 51. The processing container 51 is a hermetic vacuum container. A circular mounting table 61 having a horizontal front surface (upper surface) on which a wafer W is mounted, is provided in a lower portion of the processing container 51. Reference numeral 62 in FIG. 8 denotes a stage heater embedded in the mounting table 61, which heats the wafer W at a predetermined temperature in order to perform the processes of Steps S1 to S6. Reference numeral 63 in FIG. 8 is a column for supporting the mounting table 61 as a mounting part on the bottom surface of the processing container 51. Reference numeral 64 in FIGS. 8 and 9 denotes three vertical lift pins that move upward and downward on the surface of the mounting table 61 by a lift mechanism 65, thereby transferring the wafer W between the second substrate transfer mechanism 42 and the mounting table 61 described above.

A lower portion of a sidewall of the processing container 51 is defined as a ring-shaped lower end portion 52 which protrudes toward the center of the processing container 51 and is formed to be close to the side of the mounting table 61 as viewed from the top. An upper surface of the lower end portion 52 is horizontally formed at the same height as, for example, the front surface of the mounting table 61. In the sidewall of the processing container 51, a portion above the lower end portion 52 is defined as a sidewall main body portion 53. As described later, film-forming gases (the first film-forming gas and the second film-forming gas) are discharged so as to collide with the sidewall main body portion 53 as a collision target member. The lower end portion 52 plays the role of a guide member for guiding the film-forming gases thus discharged through the upper surface thereof toward the mounting table 61. Reference numeral 54 in FIG. 8 denotes sidewall heaters which are embedded in the lower end portion 52 and the sidewall main body portion 53, respectively. The sidewall heaters 54 adjust temperatures of the surfaces of the lower end portion 52 and the sidewall main body portion 53 inside the processing container 51, thereby adjusting a temperature of the film-forming gas colliding with the sidewall main body portion 53 and a temperature of an internal atmosphere of the processing container 51.

Figure 9:
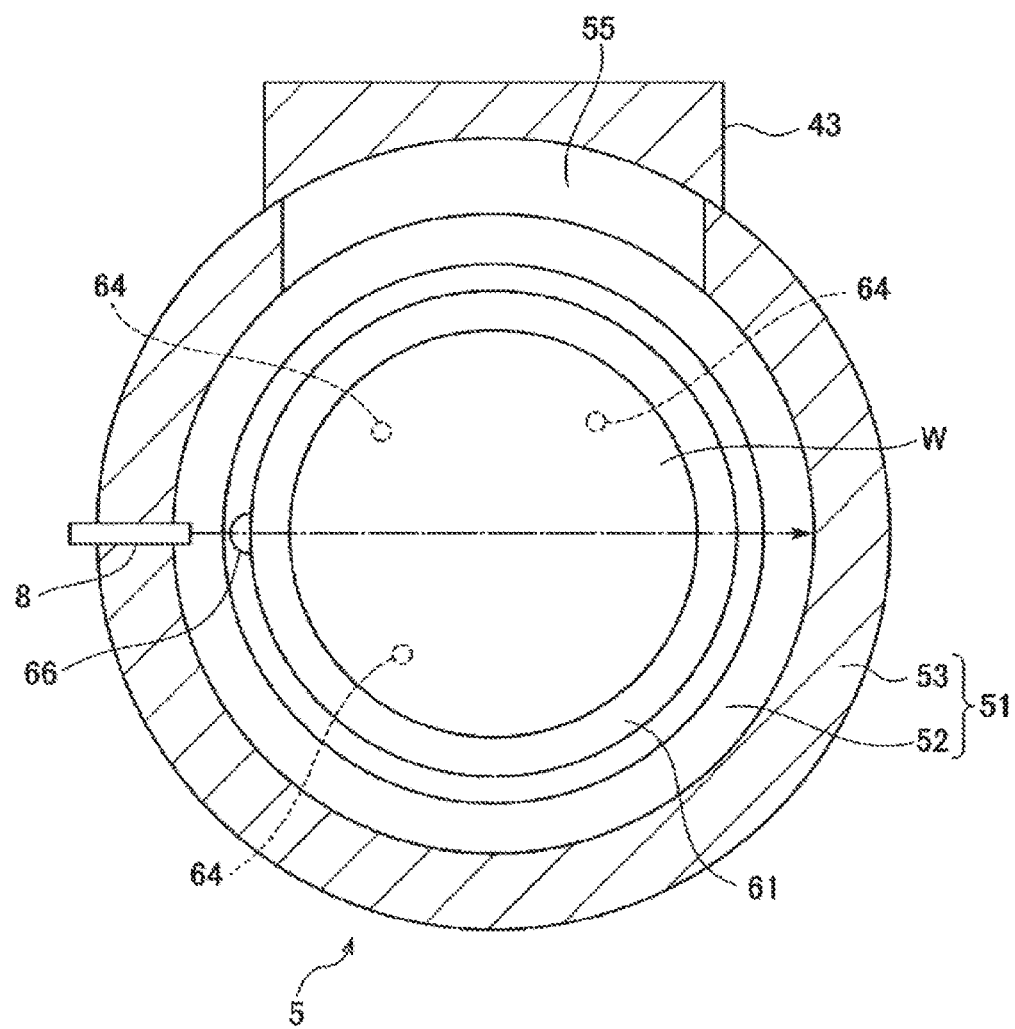
FIG. 9 is a transverse plan view of the etching module.

Reference numeral 55 in FIG. 9 denotes a transfer port 55 of the wafer W, which is opened in a portion away from a position at which the film-forming gas collides with the sidewall main body portion 53 in the circumferential direction of the processing container 51. The transfer port 55 is configured to be opened and closed by a gate valve 43. Reference numeral 66 in FIGS. 8 and 9 denotes an exhaust port opened in the bottom of the processing container 51. The exhaust port 66 is coupled to an exhaust mechanism 67 (see FIG. 8) which includes a vacuum pump, a valve, and the like, through an exhaust pipe. An exhaust amount of the exhaust port 66 is regulated by the exhaust mechanism 67 so that an internal pressure of the processing container 51 is adjusted.

A gas shower head 7 used as an etching gas supply part is provided above the mounting table 61 in a ceiling portion of the processing container 51 so as to face the mounting table 61. The gas shower head 7 includes a shower plate 71, a gas diffusion space 72, and a diffusion plate 73. The shower plate 71 is horizontally installed as a lower surface portion of the gas shower head 7 and has a plurality of gas discharge holes 74 dispersedly formed to discharge gases toward the mounting table 61 in the form of a shower. The gas diffusion space 72 is a flat space whose lower portion is partitioned by the shower plate 71 so as to supply the gases to the respective gas discharge holes 74. A diffusion plate 73 is horizontally provided so as to divide the gas diffusion space 72 into upper and lower spaces. Reference numeral 75 in FIG. 8 denotes a plurality of through-holes dispersedly formed in the diffusion plate 73. Reference numeral 77 in FIG. 8 denotes a ceiling heater for adjusting a temperature of the gas shower head 7.

A downstream end of a gas supply pipe 68 is connected to an upper portion of the gas diffusion space 72. An upstream end of the gas supply pipe 68 is coupled to an $IF_7$ gas supply source 60 through a flow rate controller 69. The flow rate controller 69 includes a valve and a mass flow controller and regulates a flow rate of a gas to be supplied toward the downstream side of the gas supply pipe 68. Respective flow rate controllers, which will be described later, are also configured the same as the flow rate controller 69. Each of the flow rate controllers regulates a flow rate of a gas to be supplied toward a downstream side of a pipe installed in the respective flow rate controller.

A gas nozzle 8 serving as a film-forming gas supply part for supplying film-forming gases (the first film-forming gas and the second film-forming gas) is provided in the sidewall main body portion 53 of the processing container 51. That is to say, the film-forming gases are supplied from a gas supply part provided separately from the gas shower head 7. The gas nozzle 8 also supplies the purge gas described above, in addition to the film-forming gases.

The gas nozzle 8 is formed in, for example, a rod shape extending in the lateral direction. A dashed dot line arrow line in each of FIGS. 8 and 9 indicates an opening direction (i.e., a gas discharge direction) of a discharge port formed in a tip end of the gas nozzle 8. As indicated by the arrows, the gas nozzle 8 discharges the gas in a horizontal direction along the diameter of the wafer W. In addition, since the destination of the gas discharge direction is the sidewall main body portion 53, the discharged gas collides with the sidewall main body portion 53 before being supplied to the wafer W. That is to say, the gas discharge port formed in the gas nozzle 8 is directed to the sidewall main body portion 53 as a collision target member, rather than the wafer W. The gas colliding with the sidewall main body portion 53 in this way flows along the upper surface of the lower end portion 52 and the upper surface of the mounting table 61 and is subsequently supplied to the wafer W, as indicated by a dotted line arrow in FIG. 8.

The reason for installing the gas nozzle 8 to have the above configuration is as follows. The discharged gas travels a long distance until it reaches the wafers W, compared with a case where the discharge port of the gas nozzle 8 is oriented to the wafer W such that the discharged gas is directly supplied toward the wafer W. This makes the discharged gas to sufficiently diffuse in the lateral direction. That is to say, the gas nozzle 8 is configured to discharge the gas toward the sidewall main body portion 53, thus supplying the respective gas in the plane of the wafer W at a high uniformity.

Reference numeral 81 in FIG. 8 denotes a gas supply pipe that is connected to the gas nozzle 8 from the outside of the processing container 51. The gas supply pipe 81 is branched at an upstream side thereof into gas introduction pipes 82 and 83. An upstream side of the gas introduction pipe 82 is coupled to a vaporizing part 92 via a series of a flow rate controller 91 and a valve V1. The vaporizing part 92 stores the H6XDA staying in a liquid state. The vaporizing part 92 includes a heater (not shown) for heating the H6XDA. In addition, one end of a gas supply pipe 94 is connected to the vaporizing part 92, and the other end thereof is coupled to an $N_2$ (nitrogen) gas supply source 96 via a series of a valve V2 and a gas heating part 95. With this configuration, heated $N_2$ gas is supplied to the vaporizing part 92 so that the H6XDA stored in the vaporizing part 92 is vaporized. A mixed gas of the $N_2$ gas used for the vaporization and the H6XDA gas is introduced into the gas nozzle 8 as the first film-forming gas.

In addition, in the gas supply pipe 94, a downstream side of the gas heating part 95 and an upstream side of the valve V2 is branched to form a gas supply pipe 97. An end portion of the gas supply pipe 97 is coupled to a downstream side of the valve V1 and an upstream side of the flow rate controller 91 in the gas introduction pipe 82 via a valve V3. Therefore, when the first film-forming gas is not supplied to the gas nozzle 8, the $N_2$ gas heated by the gas heating part 95 can be introduced into the gas nozzle 8 while bypassing the vaporizing part 92.

In addition, an upstream side of the gas introduction pipe 83 is coupled to a vaporizing part 102 via a series of a flow rate controller 101 and a valve V4. The vaporizing part 102 stores the H6XDI staying in a liquid state. The vaporizing part 102 includes a heater (not shown) for heating the H6XDI. In addition, one end of a gas supply pipe 104 is connected to the vaporizing part 102, and the other end thereof is coupled to an $N_2$ (nitrogen) gas supply source 106 via a series of a valve V5 and a gas heating part 105. With this configuration, heated $N_2$ gas is supplied to the vaporizing part 102 so that the H6XDI stored in the vaporizing part 102 is vaporized. A mixed gas of the $N_2$ gas used for the vaporization and the H6XDI gas is introduced into the gas nozzle 8 as the second film-forming gas.

In addition, in the gas supply pipe 104, a downstream side of the gas heating part 105 and an upstream side of the valve V5 is branched to form a gas supply pipe 107. An end portion of the gas supply pipe 107 is coupled to a downstream side of the valve V4 and an upstream side of the flow rate controller 101 in the gas introduction pipe 83 via a valve V6. Therefore, when the second film-forming gas is not supplied to the gas nozzle 8, the $N_2$ gas heated by the gas heating part 105 can be introduced into the gas nozzle 8 while bypassing the vaporizing part 102.

In order to prevent liquefaction of the H6XDA and H6XDI as the film-forming gases flowing through the gas supply pipe 81 and the gas introduction pipes 82 and 83, for example, pipe heaters 76 for heating the respective pipes are installed around the gas supply pipe 81 and the gas introduction pipes 82 and 83, respectively. The temperature of the film-forming gas discharged from the gas nozzle 8 is adjusted by the pipe heaters 76, the gas heating parts 95 and 105, and the heaters provided in the vaporizing parts 92 and 102. Although the pipe heater 76 is shown to be installed in only a portion of each of the gas supply pipe 81 and gas introduction pipes 82 and 83 for the sake of convenience in illustration, it may be installed over a relatively large range of the respective pipe so as to prevent the liquefaction.

A combination of the upstream side of the flow rate controller 91 in the gas introduction pipe 82, the flow rate controller 91, the vaporizing part 92, the valves V1 to V3, the gas supply pipes 94 and 97, the gas heating part 95, and the $N_2$ gas supply source 96 constitutes a first gas supply mechanism 9A. In addition, a combination of the upstream side of the flow rate controller 101 in the gas introduction pipe 83, the flow rate controller 101, the vaporizing part 102, the valves V4 to V6, the gas supply pipes 104 and 107, the gas heating part 105, and the $N_2$ gas supply source 106 constitutes a second gas supply mechanism 9B. As described above, the first gas supply mechanism 9A can supply the $N_2$ gas or the first film-forming gas to the gas nozzle 8, and the second gas supply mechanism 9B can supply the $N_2$ gas or the second film-forming gas to the gas nozzle 8.

Meanwhile, as shown in FIG. 7, the substrate processing apparatus 3 includes a control part 30 as a computer. The control part 30 includes a program, a memory, and a CPU. The program stores instructions (respective steps) for processing and transferring the wafer W described above. The program is stored in a computer-readable storage medium, such as a compact disk, a hard disk, a magneto-optical disk, a DVD, or the like, and is installed on the control part 30. The control part 30 outputs control signals to respective parts of the substrate processing apparatus 3 according to the program, thereby controlling the operations of the respective parts. More specifically, the operation of the etching module 5, the operation of the heat treatment module 40, the operation of the first substrate transfer mechanism 32, the operation of the second substrate transfer mechanism 42, and the operation of the orienter chamber 36 are controlled by the control signals. Examples of the operation of the etching module 5 include adjusting outputs of the respective heaters, supplying or cutting-off the $IF_7$ gas from the first gas supply mechanism 9A, the second gas supply mechanism 9B and the gas shower head 7, supplying or cutting-off the respective gases from the gas nozzle 8, adjusting the exhaust amount by the exhaust mechanism 67, raising or lowering the lift pins 64 by the lift mechanism 65, and the like. A combination of the control part 30 and the etching module 5 corresponds to the etching apparatus of the present disclosure.

The transfer path of the wafer W in the substrate processing apparatus 3 will be described. As described with reference to FIG. 1, the carrier 34 in which wafers W with respective films formed thereon are received are mounted on the carrier mounting table 35. Then, the wafer W is transferred in the order of the normal-atmosphere transfer chamber 33→the orienter chamber 36→the normal-atmosphere transfer chamber 33→the load lock chamber 41, and is subsequently transferred to the etching module 5 through the heat treatment module 40. Thereafter, as described above, the cycle of Steps S1 to S6 is repeatedly performed, thereby processing the wafer W. Subsequently, the wafer W is transferred to the heat treatment module 40 where the wafer W is subjected to the process of Step S7. Thereafter, the wafer W is transferred in the order of the load lock chamber 41→the normal-atmosphere transfer chamber 33 and is returned to the carrier 34.

Figure 10:
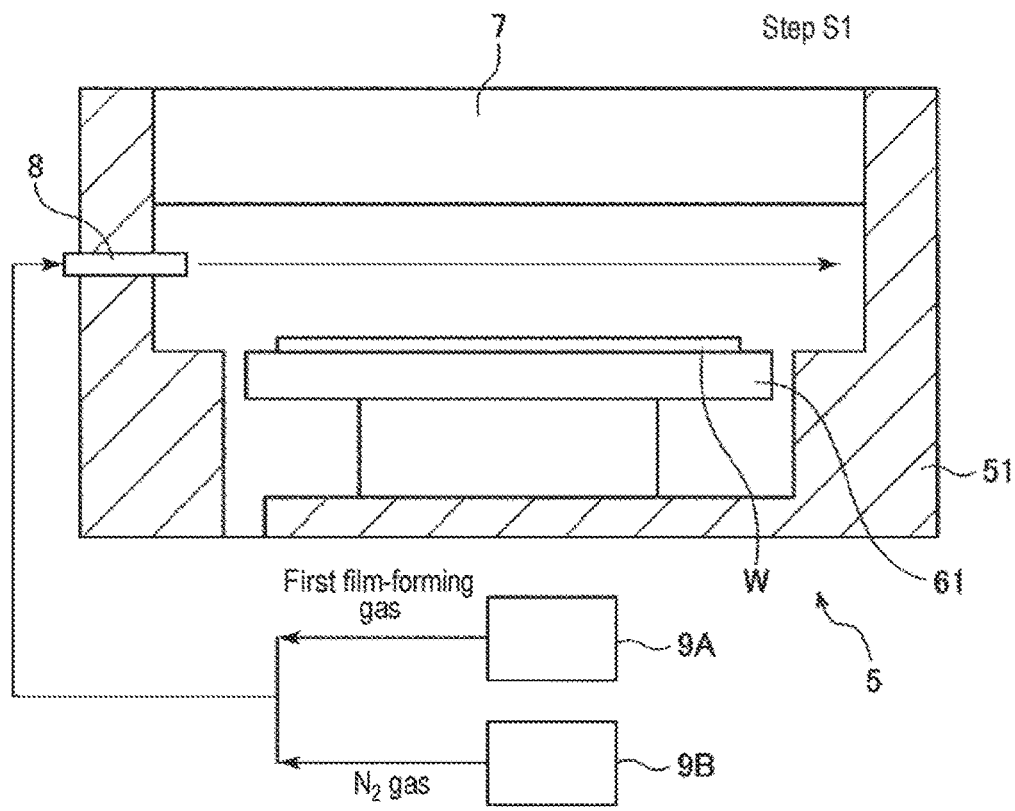
FIG. 10 is an explanatory view showing the operation of the etching module.
Figure 11:
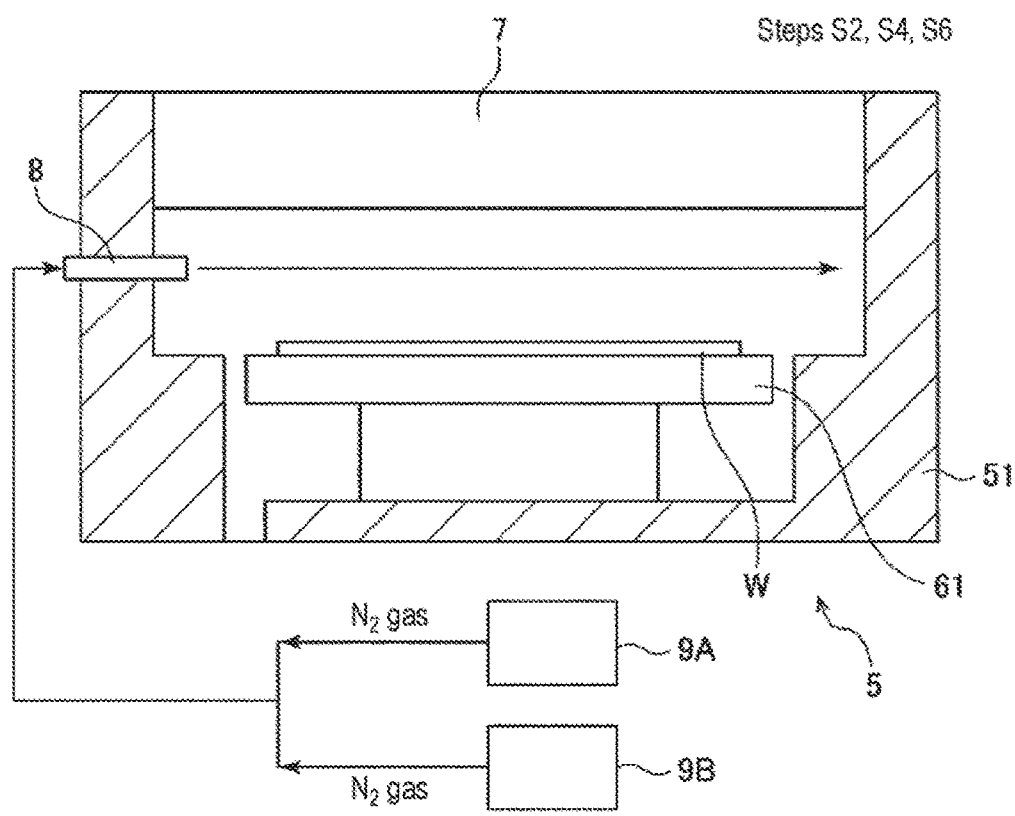
FIG. 11 is an explanatory view showing the operation of the etching module.
Figure 12:
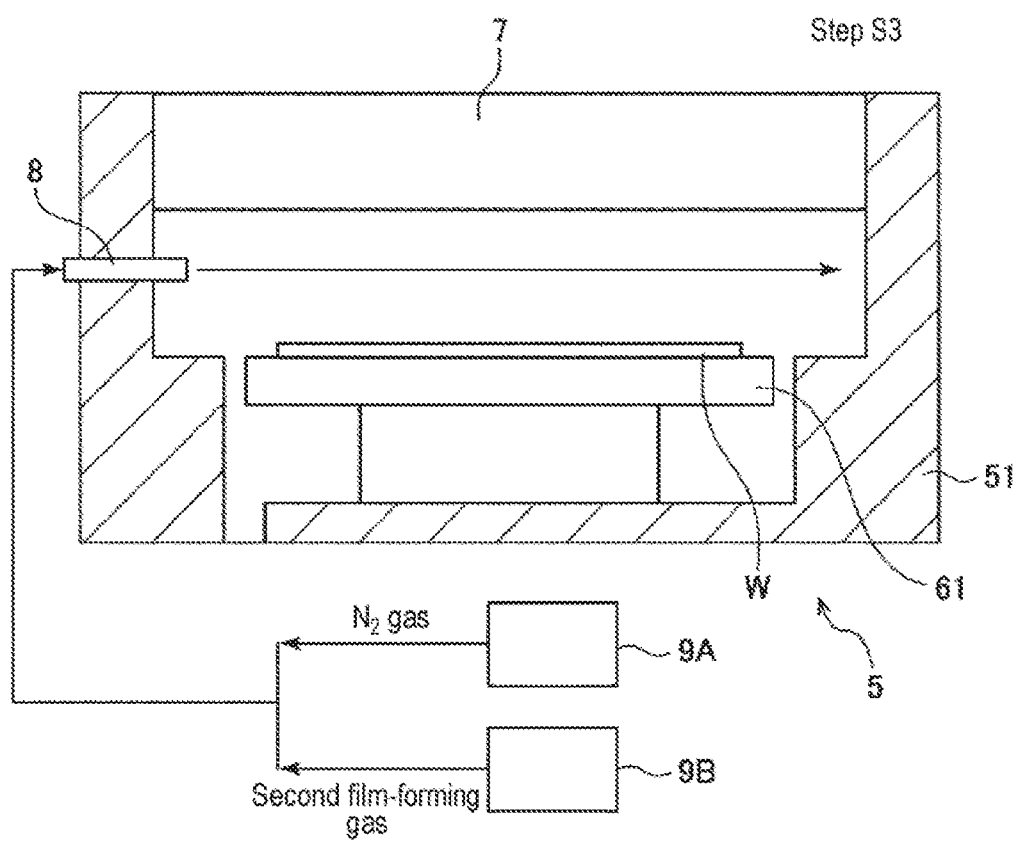
FIG. 12 is an explanatory view showing the operation of the etching module.

Next, a correspondence relationship between Steps S1 to S6 performed in the etching module 5 and the gases supplied from the first gas supply mechanism 9A and the second gas supply mechanism 9B which are provided in the etching module 5 will be described with reference to FIGS. 10 to 13. The first film-forming gas and the $N_2$ gas are supplied to the gas nozzle 8 from the first gas supply mechanism 9A and the second gas supply mechanism 9B, respectively, and a mixed gas of the first film-forming gas and the $N_2$ gas is discharged from the gas nozzle 8, thereby performing Step S1 (FIG. 10). Subsequently, the $N_2$ gas is supplied to the gas nozzle 8 from the first gas supply mechanism 9A and the second gas supply mechanism 9B, respectively. The $N_2$ gas is discharged as a purge gas from the gas nozzle 8, thereby performing Step S2 (FIG. 11). Thereafter, the $N_2$ gas and the second film-forming gas are supplied to the gas nozzles 8 from the first gas supply mechanism 9A and the second gas supply mechanism 9B, respectively, and a mixed gas of the $N_2$ gas and the second film-forming gas is discharged from the gas nozzle 8, thereby performing Step S3 (FIG. 12). Thereafter, the $N_2$ gas is supplied to the gas nozzles 8 from the first gas supply mechanism 9A and the second gas supply mechanism 9B, respectively, as in Step S2. The $N_2$ gas is discharged as a purge gas from the gas nozzle 8, thereby performing Step S4 (FIG. 11).

Figure 13:
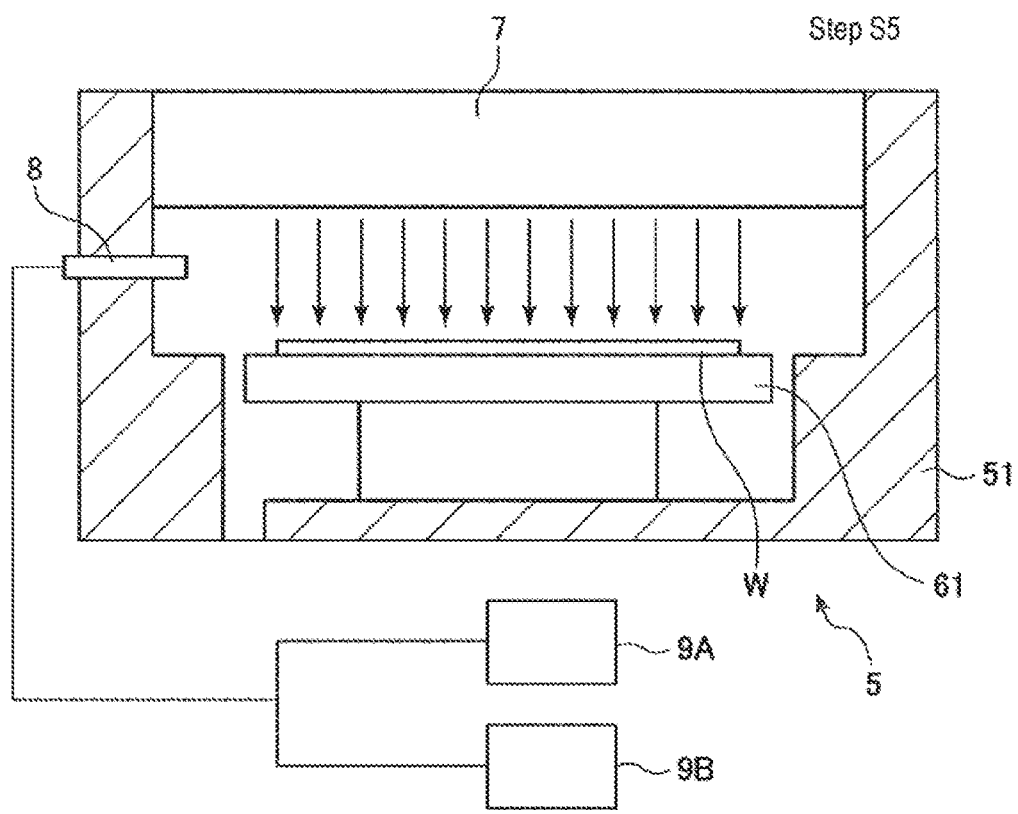
FIG. 13 is an explanatory view showing the operation of the etching module.

Subsequently, for example, in the state where the supply of the respective gases from the first gas supply mechanism 9A and the second gas supply mechanism 9B to the gas nozzle 8 is stopped, the $IF_7$ gas is supplied from the gas shower head 7, thereby performing Step S5 (FIG. 13). In addition, any gas may be used in Step S5 as long as it is a F-based gas capable of etching Si such as a $CIF_3$ gas, a $F_2$ gas or the like as described above. Thereafter, the $N_2$ gas is supplied to the gas nozzle 8 from the first gas supply mechanism 9A and the second gas supply mechanism 9B, respectively, as in Steps S2 and S4. The $N_2$ gas is discharged as a purge gas from the gas nozzle 8, thereby performing Step S6 (FIG. 11).

When the wafer W is processed in the etching module 5 in this way, the temperature of the wafer W may be lower than temperature of the film-forming gases (the first film-forming gas and the second film-forming gas) discharged from the gas nozzle 8 by controlling the output of the pipe heaters 76 and the stage heater 62, such that the discharged film-forming gases are efficiently adsorbed onto the wafer W. In addition, the temperature of the sidewall main body portion 53 may be lower than the temperature of the film-forming gas discharged from the gas nozzle 8 by controlling the output of the pipe heaters 76 and the sidewall heaters 54, such that the temperature of the film-forming gas colliding with the sidewall main body portion 53 drops down. As the temperature of the colliding film-forming gas drops down, the temperature of the film-forming gas becomes relatively low when it reaches the wafer W. This allows the film-forming gas to be more efficiently adsorbed onto the wafer W. In this case, in order to prevent a film from being formed on the sidewall main body portion 53, for example, the output of the stage heater 62 and the sidewall heaters 54 is controlled such that the temperature of the sidewall main body portion 53 is higher than the temperature of the wafer W.

It is preferable to supply both the etching gas and the film-forming gases in the plane of the wafer W at a high uniformity. The polyurea films 23 formed by the film-forming gases are sacrificial films to be removed from the wafer W after the etching process as described above. Thus, it is preferable to supply the etching gas for forming a pattern on the wafer W in the plane of the wafer W at a high uniformity. It is expected that the gas shower head 7, which supplies the gas in the form of a shower, can supply the gas in the plane of the wafer W at higher uniformity than the gas nozzle 8. Furthermore, the gas shower head 7 tends to have a narrow flexible passage formed therein in order to supply the gas more uniformly from the gas discharge holes 74 while increasing the diffusivity of the gas. That is to say, the gas flowing through the passage inside the gas shower head 7 undergoes a relatively large pressure loss. Therefore, the etching module 5 is configured such that the etching gas is supplied to the wafer W at a high uniformity from the gas shower head 7 and the film-forming gas is discharged from the gas nozzle 8 from the viewpoint of preventing liquefaction due to pressure loss inside the passage.

In the etching module 5, the first film-forming gas and the second film-forming gas may be discharged from individual gas nozzles. In addition, the gas nozzle 8 may have, for example, a discharge port having a large width in the lateral direction. The exhaust port 66 is not limited to be opened in the bottom of the processing container 51. As an example, the exhaust port 66 may be opened in the sidewall of the lower portion of the processing container 51. Furthermore, the purge gas may be discharged from the gas shower head 7. The etching gas may be supplied to the wafer W from an additional gas supply part which is installed in the ceiling of the processing container 51 and has a gas discharge port opened concentrically along the periphery of the wafer W as viewed from the top, instead of the gas shower head 7. That is to say, the etching gas supply part is not limited to be configured by the gas shower head 7.

In addition, the substrate processing apparatus 3 may be configured such that, for example, a transfer chamber kept in a vacuum atmosphere and equipped with a transfer mechanism for the wafer W, is connected to a film-forming module and an etching module, each of which includes a processing container whose interior is kept in a vacuum atmosphere. In this case, the film-forming module is configured to perform Steps S1 to S4, and the etching module is configured to perform Steps S5 and S6. By repeatedly transferring the wafer W between the etching module and the film-forming module by the transfer mechanism provided in the transfer chamber kept in a vacuum atmosphere, the cycle of Steps S1 to S6 is repeatedly performed. That is to say, the film formation and etching process may be performed in different processing containers. However, since the substrate processing apparatus 3 uses the etching module 5, it is possible to reduce a time period required for transferring the wafer W between the modules when repeatedly performing the above-described cycle, thereby improving the throughput.

Figure 14:
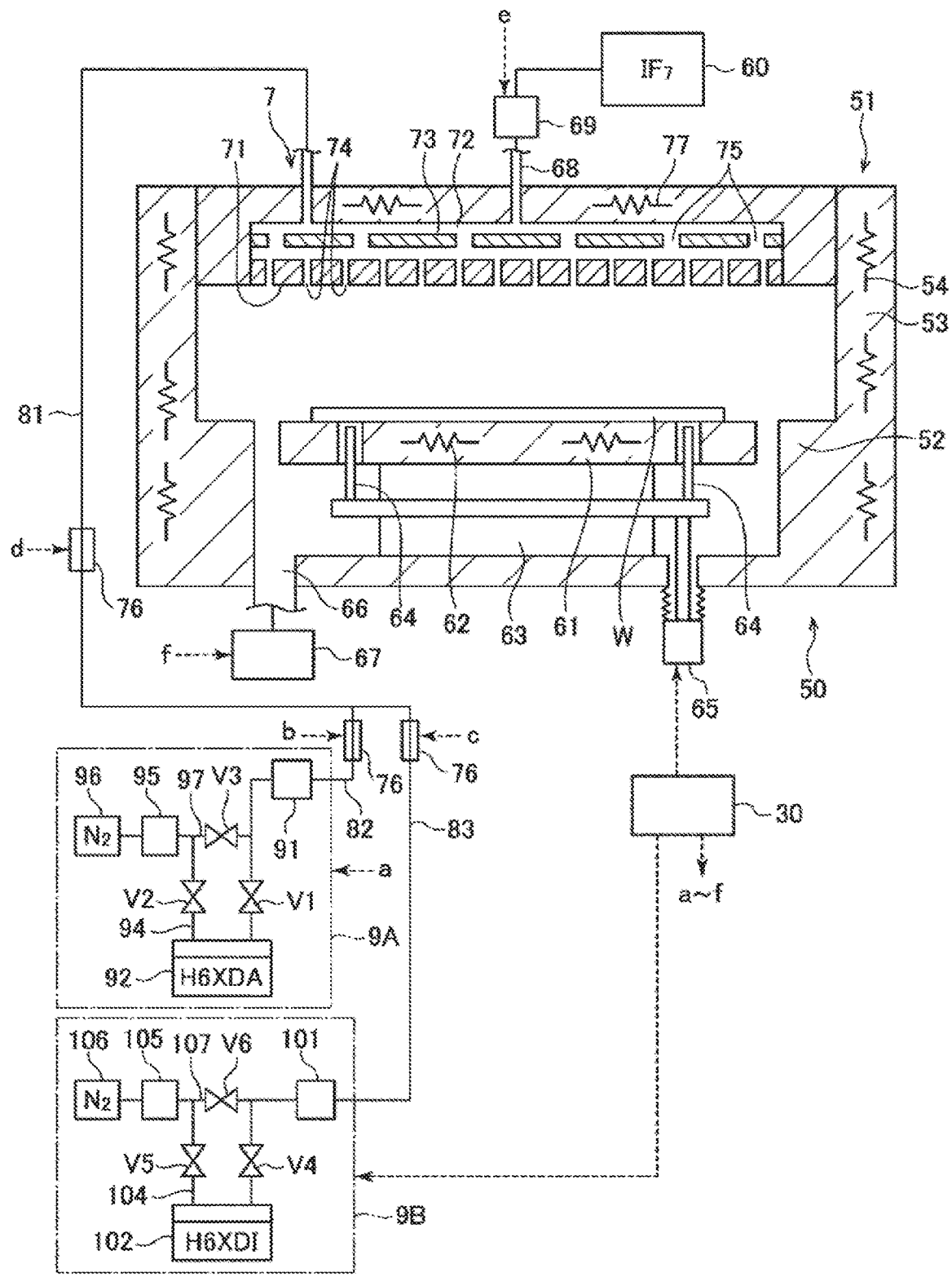
FIG. 14 is a longitudinal sectional view showing an example of configuration of another etching module.

FIG. 14 shows an etching module 50 as a modification of the etching module 5. The etching module 50 will be described with a focus on the differences from the etching module 5. The etching module 50 is not provided with the gas nozzle 8. The downstream end of the gas supply pipe 81 is connected to the gas shower head 7 such that the film-forming gas is supplied to the gas diffusion space 72. Therefore, in the etching module 50, both the etching gas and the film-forming gas are supplied from the gas shower head 7 into the processing container 51. Since the film-forming gas is discharged from the gas shower head 7 in this way, the lower end portion 52 of the processing container 51 for guiding the film-forming gas discharged from the gas nozzle 8 may be omitted. That is to say, the surface of the sidewall of the processing container 51 may be formed as a vertical surface without protruding toward the mounting table 61.

In some embodiments, the order of supplying the first film-forming gas containing an amine, the second film-forming gas containing an isocyanate, the etching gas, and the purge gas into the processing container 51 is not limited to the example described above. For example, the first film-forming gas and the second film-forming gas may be supplied into the processing container 51 in a simultaneous manner rather than a sequential manner. That is to say, the first and second film-forming gases, the purge gas, the etching gas, and the purge gas may be supplied in the named order. In addition, assuming that the supply of the film-forming gases, the etching gas, and the purge gas performed in that order is one cycle, the cycle may be repeated with respect to one sheet of wafer W so that the formation of the polyurea films 23 and the etching of the polysilicon film 14 are alternately repeatedly performed. Alternatively, the first film-forming gas, the second film-forming gas, and the etching gas may be simultaneously supplied into the processing container 51. That is to say, the polysilicon film 14 may be etched while the polyurea films 23 are formed in the respective pores 16 of the SiOCN film 15. In this case, the purge gas is supplied to purge the interior of the processing container 51 after the first film-forming gas, the second film-forming gas, and the etching gas are supplied. In addition, assuming that the supply of the first film-forming gas, the second film-forming gas and the etching gas, followed by the supply of the purge gas is one cycle, one sheet of wafer W may be processed by repeating the cycle. When the wafer W is processed in the etching module 5 or 50, the control part 30 outputs control signals to respective parts of the etching module 5 or 50 so as to perform such a process.

The present disclosure is not limited to the above-described embodiments and may be appropriately modified, and the respective embodiments may be combined with each other.

<Evaluation Tests>

Evaluation tests 1 and 2 conducted in connection with the present disclosure will be described. As to Evaluation test 1, a process of removing the polysilicon film 14 from the wafer W having the surface portion shown in FIG. 1 was performed, as described in the Background section of the present disclosure. More specifically, the polysilicon film 14 was removed by isotropic dry etching to reach the vicinity of the interface between the silicon oxide film 12 and the SiGe film 1. Thereafter, the lower polysilicon film 14 was removed by anisotropic etching such that the recess 17 is formed to have a sidewall defined by the SiOCN film 15 as shown in FIG. 5. Thereafter, the first film-forming gas and the second film-forming gas were supplied to the wafer W so that the polyurea film 23 having a thickness of 4 nm was formed so as to cover the surface of the wafer W including the sidewall of the recess 17. Subsequently, the IF$_7$ gas was supplied to the wafer W as shown in FIG. 14. As a result of confirming the state of the SiGe film 11, it was confirmed that no damage occurred. It is considered from the test result that the SiGe film 11 can be protected from the IF gas-based etching by forming the polyurea films 23 so as to be embedded in the pores 16 of the SiOCN film 15, as described with reference to FIGS. 2A to 4D.

Next, Evaluation test 2 will be described. In Evaluation test 2, the processes described in FIGS. 2A to 5 were performed with respect to a test substrate using a test apparatus that is configured to supply various gases into the processing container 51 kept in a vacuum atmosphere, similar to the etching module 5 or 50. That is to say, after repeating the cycle of Steps S1 to S6, the test substrate was heated to depolymerize the polyurea films 23 in Step S7. The test substrate has a film structure described in FIG. 1. After the heating process in Step S7 is performed, it was checked whether or not the polyurea films 23 remained in the pores 16 of the SiOCN film 15 and whether or not the SiGe film 11 was damaged by the etching gas. In addition, the repetition of the cycle of Steps S1 to S6 was performed after supplying an etching gas into the processing container 51 to etch the upper portion of the polysilicon film 14, followed by purging the interior of the processing container 51.

Process conditions applied in Steps S1 to S4, namely process conditions applied when supplying the first film-forming gas, when supplying the second film-forming gas, and when purging the processing container immediately after the supply of the first film-forming gas or the second film-forming gas) will be described. The internal pressure of the processing container 51 was 0.1 Torr (13.3 Pa) to 10 Torr (1,333 Pa), and the temperature of the substrate was 0 degrees C. to 100 degrees C. In addition, tert-butylamine was used as the first film-forming gas and tert-butylisocyanic acid was used as the second film-forming gas, respectively. The first film-forming gas and the second film-forming gas were supplied to the processing container 51 at 20 sccm to 500 sccm, respectively. The N$_2$ gas as a purge gas was supplied to the processing container 51 at 100 to 1000 sccm.

Process conditions applied to the etching performed before the aforementioned cycle of Steps S1 to S6, the etching in Step S5, and the purging performed immediately after these etchings will be described. The internal pressure of the processing container 51 was 0.1 Torr to 10 Torr, and the temperature of the substrate was 0 degrees C. to 100 degrees C. A ClF$_3$ (chlorine trifluoride) gas was used as the etching gas. The N$_2$ gas as a purge gas was supplied into the processing container 51 at 100 to 1,000 sccm.

As process conditions applied to the depolymerization in Step S7, the internal pressure of the processing container 51 was 0.1 Torr to 10 Torr, and the temperature of the substrate was 100 degrees C. to 400 degrees C. Furthermore, in the depolymerization, the N$_2$ gas as a purge gas was supplied to the processing container 51 at 100 sccm to 2,000 sccm.

The polysilicon film 14 was etched by 80 nm in a vertical direction by the etching performed before the cycle of Steps S1 to S6. The polysilicon film 14 was etched by 60 nm in the vertical direction by the etching performed in Step S5. The cycle of Steps S1 to S6 was performed three times. Accordingly, the polysilicon film 14 was etched by 260 nm in total in Evaluation test 2. A time interval between the film formation and the subsequent purging, namely a time interval between the start of Step S and the end of Step S4 was 5 minutes. In addition, a change in weight before and after the process in Evaluation test 2 was 128 wt ppm.

As a result of checking the substrate after the execution of Step S7 as described above, no polyurea films 23 were found to remain in the pores 16 of the SiOCN film 15, and no damage was identified in the SiGe film 11. Therefore, the effect of the process of the present disclosure was confirmed from the result of Evaluation test 2.

According to the present disclosure, a film-forming gas is supplied to a substrate in which a silicon-containing film, a porous film, and a film not to be etched are formed adjacent to each other in the named order in the lateral direction. A film of preventing an etching gas from passing therethrough is formed in each pore of the porous film in order to prevent the etching gas for etching the silicon-containing film from being supplied to the film not to be etched. This suppresses the film not to be etched from being etched when etching the silicon-containing film.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. An etching method comprising:
   forming a blocking film configured to prevent an etching gas for etching a silicon-containing film from passing through each pore of a porous film and prevent the etching gas from being supplied to a film not to be etched, by supplying at least one film-forming gas to a substrate in which the silicon-containing film, the porous film, and the film not to be etched are sequentially formed adjacent to each other; and
   etching the silicon-containing film by supplying the etching gas.

2. The method of claim 1, further comprising: repeating, a plurality of times, the forming a blocking film and the etching the silicon-containing film in this order.

3. The method of claim 2, wherein the at least one film-forming gas includes a first film-forming gas and a second film-forming gas, and
   wherein the forming a blocking film includes:
   supplying the first film-forming gas and the second film-forming gas to the substrate in this order; and
   causing the first film-forming gas and the second film-forming gas to react with each other to form the blocking film.

4. The method of claim 3, further comprising: exhausting an atmosphere around the substrate between the supply of the first film-forming gas and the supply of the second film-forming gas, between the supply of the second film-forming gas and the supply of the etching gas, and between the supply of the etching gas and the supply of the first film-forming gas, respectively.

5. The method of claim 1, wherein the supply of the etching gas to the substrate and the supply of the film-forming gas to the substrate are performed simultaneously.

6. The method of claim 1, further comprising: after the forming a blocking film and the etching the silicon-containing film, heating the substrate to vaporize and remove the blocking film from the pores of the porous film.

7. The method of claim 1, wherein an etching mask film is formed on the film not to be etched.

8. The method of claim 1, wherein the blocking film is a polymer having a urea bond.

* * * * *